United States Patent [19]

Yamazaki et al.

[11] Patent Number: 4,636,401
[45] Date of Patent: Jan. 13, 1987

[54] APPARATUS FOR CHEMICAL VAPOR DEPOSITION AND METHOD OF FILM DEPOSITION USING SUCH DEPOSITION

[75] Inventors: Shunpei Yamazaki; Mamoru Tashiro; Minoru Miyazaki, all of Tokyo, Japan

[73] Assignee: Semiconductor Energy Laboratory Co., Ltd., Japan

[21] Appl. No.: 701,738

[22] Filed: Feb. 14, 1985

[30] Foreign Application Priority Data

Feb. 15, 1984 [JP] Japan .................................. 59-26594

[51] Int. Cl.[4] .......................................... C23C 13/08
[52] U.S. Cl. .................... 427/39; 427/53.1; 427/74; 427/85; 427/255.2; 118/692; 118/683; 118/715; 118/719; 118/723; 118/50.1
[58] Field of Search ............... 118/692, 683, 715, 719, 118/723, 50.1; 427/39, 74, 85, 53.1, 255.2; 148/DIG. 148

[56] References Cited

U.S. PATENT DOCUMENTS 4,171,235 10/1979 Fraas et al. .......................... 118/719
4,435,445 3/1984 Allred et al. ...................... 427/86 X
4,461,783 7/1984 Yamazaki .............................. 427/39
4,485,125 11/1984 Izu et al. ........................... 427/39 X

FOREIGN PATENT DOCUMENTS 56-152738 11/1981 Japan ................................... 118/692
58-173826 10/1983 Japan ..................................... 427/39
59-16328 1/1984 Japan ................................... 118/719

OTHER PUBLICATIONS

Dylla, "Turbomolecular Pump Vacuum System for the Princeton Large Torus", *J. Vac. Sci. & Tech.*, vol. 15, No. 2, pp. 734-740, 1978.
Outlaw, "Ultrahigh Vacuum Produced by a Combination of Turbomolecular and Titanium Sublimation Pumping", *J. Vac. Sci. & Tech.*, vol. 3, No. 6, pp. 352-354, 1966.
Weil et al, "Glow-Discharge a-SiiF Prepared from $SiF_2$ Gas", *Journal de Physique*, Oct. 1981, pp. 643-646.
Maissel et al, *Handbook of Thin Film Technology*, McGraw-Hill Book Company, pp. 2-4 to 2-9.

*Primary Examiner*—Richard Bueker
*Attorney, Agent, or Firm*—Gerald J. Ferguson, Jr.; Michael P. Hoffman; Ronni S. Malamud

[57] ABSTRACT

An apparatus for conducting chemical vapor deposition reduced pressure, comprising: means for feeding reactive gases; a reaction vessel for depositing a film layer from the reactive gases by application of thermal energy, light energy or electric energy singly or in combination; an exhaust means for exhausting unnecessary reactive gases and unnecessary reaction products from the reaction vessel and for vacuumizing or reducing pressure of the reaction vessel, including a turbo molecular pump and a pressure control valve interposed between the reaction vessel and a roughing rotary pump; and a method of chemical vapor deposition using such apparatus.

15 Claims, 2 Drawing Figures

APPARATUS FOR CHEMICAL VAPOR DEPOSITION AND METHOD OF FILM DEPOSITION USING SUCH DEPOSITION

BACKGROUND OF THE INVENTION (i) Field of the Invention

This invention relates to chemical vapour deposition, and more particularly to semiconductor film deposition by chemical vapour deposition.

More specifically, the invention concerns an apparatus and a method for producing a semiconductor device having a PIN junction, depositing semiconductor films by plasma chemical vapour deposition (hereinafter referred to simply as "PCVD" for brevity) employing a single reaction chamber or a series of reaction chambers (a multi-chamber system) for laminating a P-type non-single crystal semiconductor film, an I-type non-single crystal semiconductor film and an N-type non-single crystal semiconductor film successively on a substrate in the respective reaction chambers.

(ii) Description of the Prior Art

In a conventional CVD apparatus, for instance, in a PCVD apparatus where the pressure of the reaction system is as high as 0.01 to 10 Torr, it has been the general practice to employ an exhaust system with a rotary pump alone due to a difficulty of providing a turbo pump for the purpose of producing a higher degree of vacuum. However, since a rotary pump which is solely resorted to by the exhaust system of the conventional PCVD apparatus involves discontinuous rotational movements, there occur reverse flows of the atmospheric air (especially oxygen) from the exhaust system which is in contact with the atmosphere, the backflow air partly entrained in oil and creeping into the reactor by regasification, as a result infusing into the film being formed in the reactor. Therefore, the oxygen concentration in the film sometimes reaches to a value of $5 \times 10^{19}$ to $2 \times 10^{20}$ cm$^{-3}$ in the case of a silicon film.

SUMMARY OF THE INVENTION

The present invention contemplates to employ a turbo molecular pump for the exhaust system in the so-called CVD apparatus in which a film (of a non-oxide) is deposited by the use of reactive gases, for suppressing the oxygen concentration in the film to a value smaller than $4 \times 10^{18}$ cm$^{-3}$.

Namely, for the purpose of preventing backflows of air from an exhaust system during formation of an oxygen-free or non-oxide film, the present invention employs a continuous exhaust type complex or turbo molecular pump (hereinafter referred to simply as "turbo pump" for brevity) in combination with a discontinuous rotation type roughing vacuum pump such as a rotary oil pump, a mechanical booster pump or the like (hereinafter referred to simply as "rotary pump" for brevity), interposing the turbo pump between a reaction vessel and the vacuum pump.

It is therefore an object of the present invention to prevent backflows of air from an exhaust system during deposition of a non-oxide film such as a non-single crystal silicon film by the use of a reactive gas, i.e., a silane of $Si_nH_{2n+2}$ (wherein $n \geq 1$).

It is another object of the invention to prevent backflows of oil components from a rotary pump and of air entrained in oil during operation of the rotary pump by means of a turbo pump which is interposed between a CVD reaction vessel and the rotary pump through a pressure control valve, thereby to ensure deposition of an oxide-free film of high quality.

It is still another object of the invention to vacuumize a reaction vessel prior to CVD to a level of $3 \times 10^{-8}$ Torr or a lower pressure level (of $3 \times 10^{-8}$ to $1 \times 10^{-10}$ Torr) through a duct of a large diameter which interconnects the reaction vessel and a turbo pump.

It is a further object of the invention to vacuumize a reaction vessel to the background level (lower than $3 \times 10^{-8}$ Torr) in a shorter time period as compared with the conventional operation using a rotary pump alone, by employing a gate valve of a large diameter (e.g., 5 to 10 inches) between the reaction vessel and a turbo pump.

Another object of the invention is to employ as a turbo pump a complex molecular pump which is capable of vacuumizing a reaction vessel even to a level of 0.01 to 10 Torr, along with a pressure regulator valve which is interposed between the turbo pump and a rotary pump, thereby to control the pressure in both the turbo pump and reaction vessel.

A further object of the invention is to form hydrogen- or halogen-added non-single crystal semiconductor layers of P, I and N types with small recombination center density.

Still another object of the invention is to deposit semiconductor layers free of an interlayer insulator which is formed by oxidation of part of a deposited layer due to contact with the atmospheric air, particularly with oxygen.

It is a further object of the invention to realize mass production by multi-chamber PCVD employing a series of reaction chambers to carry out the respective reactions independently of each other, depositing semiconductor films simultaneously on a plural number of substrates at high film growth speeds.

It is a further object of the present invention to laminate a plural number of semiconductor film layers with a PIN, PIP, NIN or PINPIN . . . PIN junction successively and automatically on a substrate without influenced by (or infusion of) a previously deposited semiconductor layer no matter whether it is a homo-conduction type (the same material) or a hetero-conduction type (a different material).

Still another object of the invention is to form semiconductor layers of good quality on a substrate by combined use of PCVD and photo CVD.

To achieve the foregoing objectives, the present invention provides an apparatus for conducting chemical vapour deposition, comprising: means for feeding reactive gases; a reaction vessel for depositing a layer from the reactive gases by application of thermal energy, light energy or electric energy singly or in combination; an exhaust means for exhausting unnecessary reactive gases and unnecessary reaction products from the reaction vessel and for vacuumizing or reducing pressure of the reaction vessel, including a turbo molecular pump and a pressure control valve interposed between the reaction vessel and a roughing vacuum pump.

According to the invention, there is also provided a method for conducting CVD in an apparatus including means for feeding reactive gases, a reaction vessel for depositing a film layer from the reactive gases by application of thermal energy, light energy or electric energy singly or in combination, an exhaust means for exhausting unnecessary reactive gases and unnecessary reaction products from the reaction vessel and for vacuumizing or reducing pressure of the reaction vessel, including a turbo molecular pump and a pressure control valve interposed between the reaction vessel and a roughing vacuum pump.

The above and other objects, features and advantages of the invention will become apparent from the following description and appended claims, taken in conjunction with the accompanying drawings.

DESCRIPTION OF PREFERRED EMBODIMENTS

Firstly, the PCVD apparatus according to the invention is explained in connection with formation of a PIN junction on a substrate.

Figure 1:
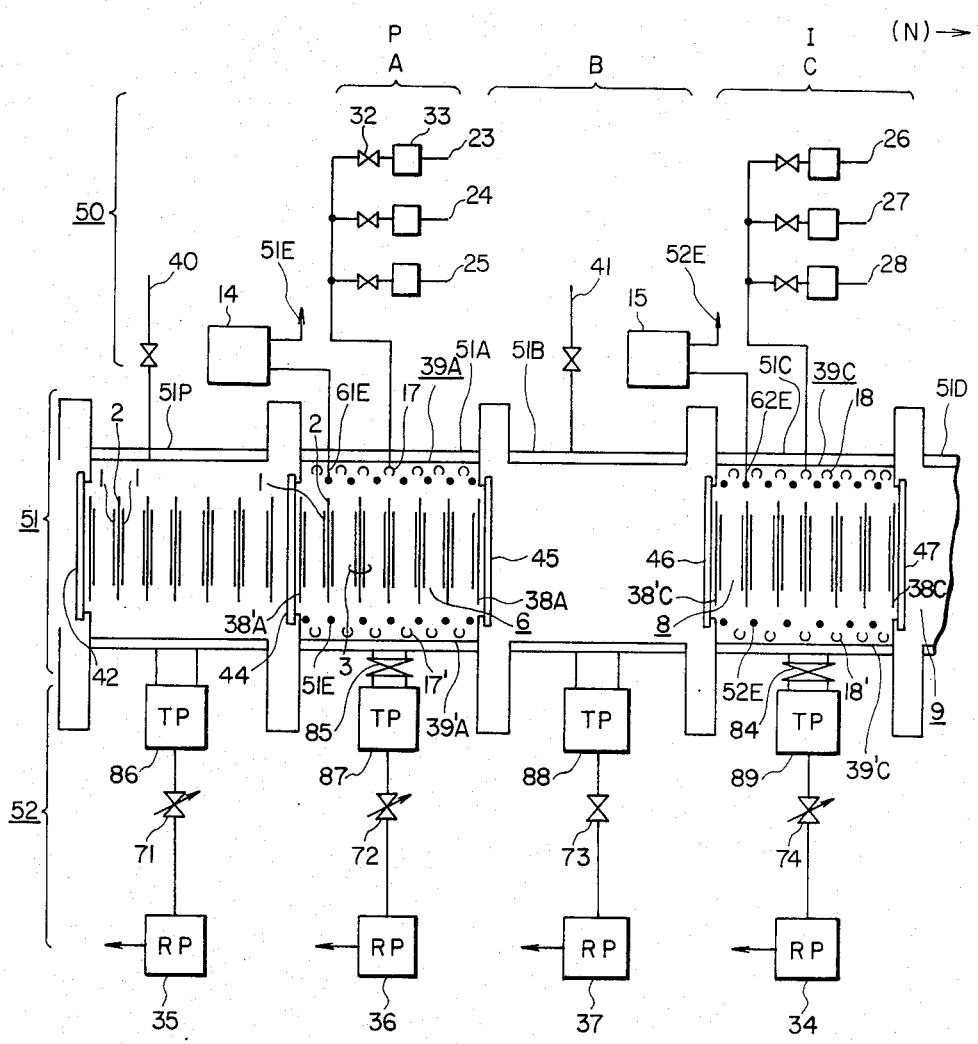
FIG. 1 is a schematic illustration of an apparatus for depositing semiconductor layers by multichamber PCVD according to the invention.

Referring to FIG. 1, there is schematically shown a multi-chamber PCVD apparatus according to the invention, which is constituted by a doping system 50 for introducing reactive gases, a reaction system 51, and an exhaust system 52. The reaction system 51 includes a preliminary chamber 51P, a first reaction chamber 51A for depositing a P-type semiconductor layer, a second reaction chamber 51C for depositing an I-type semiconductor layer and buffer chamber 51B which is interposed between the first and second reaction chambers 51A and 51C, and buffer chamber 51D which is interposed between the second reaction chamber 51C and a third reaction chamber (not shown) for depositing an N-type semiconductor layer. The first and second reaction chambers 51A and 51C are provided with gate valves 44 to 47.

As shown in FIG. 1, the PCVD apparatus is provided with the doping system 50 and exhaust system 52 for the respective reactive gases, including feed and exhaust nozzles which are mounted through insulating hoods. More specifically, paired electrodes 51E, 61E, 52E and 62E, reactive gas feed nozzles 17 and 18, exhaust nozzles 17' and 18' are located opposingly on the inner side of the insulating hoods 39A, 39'A, 39C and 39'C which are so formed as to enclose the just-mentioned electrodes. The outer peripheries of the reaction spaces between these hoods are shielded by insulators or conductors 38A, 38'A, 38C and 38'C.

Although omitted from illustration, doors are provided at the fore and rear ends of the reaction chambers, mounting a substrate heating means such as a halogen lamp on the inner side of each door.

In the preliminary chamber 51P at the entrance of the apparatus, a couple of substrates 1 are set on the opposite sides of each substrate holder 3 (of an insulator or conductor) through a door 42. The holders 3 are supported at uniform intervals on an outer frame jig 38 (the outer peripheral portions of which alone are indicated at 38A, 38'A, 38C and 38'C). More specifically, holders 3 each support a couple of substrates on the opposite sides in such a manner as to expose the film-depositing sides of the substrates, holding them in upright positions and at uniform intervals of 6 cm±0.5 cm within the outer frame jig 38. Consequently, it is possible to deposit films simultaneously on ten 15 cm×30 cm substrates. The reaction spaces 6 and 8 with dimensions of 55 cm (height), 40 cm (depth) and 40 cm (width) are enclosed by the insulators 39A, 39C, 39'A and 39'C on the upper and lower sides and by the insulating or conductive outer frame jigs 38A, 38'A, 38C and 38'C at the opposite ends. Connected between the reaction chambers 51A and 51C and turbo pumps 87 and 89 are gate valves 85 and 84, and between the turbo valves 87 and 89 and rotary valves 36 and 34 are pressure regulator valves 72 and 74.

The preliminary chamber 51P is vacuumized by the rotary pump 35 through the turbo pump 86 and stop valve 71. This turbo pump 86 may be, for example, a complex molecular pump TG550, a product of Osaka Vacuum Co., with a rated speed of 400 r.p.s. and an exhaustion rate of 500 liter/second for $N_2$ and $SiH_4$. It can exhaust gases even when the pressure in the vessel is 0.01 to 10 Torr, attaining a rate of 10 liter/sec even at 10 Torr. Especially in a pressure range of 0.1 to 1 Torr which is generally used for CVD, exhaustion at a rate of 450 to 440 liter/sec is feasible. The rotational speed of the turbo pump is rendered variable in the present invention. Therefore, even if the reaction vessel is at the atmospheric pressure, the rotational speed of the turbo pump is put in continuous operation at a speed of 100 to 200 r.p.s. which is lower than in constant speed operation. Accordingly, when the reaction vessel is under the atmospheric pressure, it can be vacuumized by the rotary pump through an opened valve 71 a turbo valve which is in exhausting operation. By so doing, it becomes possible to prevent backflows of oil components from the rotary pump RP to preclude contamination of the substrate surfaces with the oil components.

Thereafter, pressure regulator valve 72 and gate valve 85 are geared to the same inside diameter as the turbo pump TP. After fully opening the gate valve 85 and the gate valve 44 (with an opening of 35 cm×30 cm) partitioning the reaction chamber 51A, which has been vacuumized to a level below $3\times10^{-8}$ Torr by the turbo pump (also TG550), the substrates retained in the outer frame jig 38 are transferred, for example, from the preliminary chamber 51P into the first reaction chamber 51A. After closing the gate valve 44, the substrates are further moved into the first reaction chamber 51A.

At this time, the substrates which have been in the first reaction chamber 51A are advanced to the buffer chamber 51B beforehand or simultaneously. Similarly, the substrates 1 which have been in the buffer chamber 51B and the second reaction chamber 51C are transferred into the second reaction chamber 51C and the second buffer chamber 51D, respectively.

EXAMPLES

Following are examples of production of semiconductor layers with a PIN junction by the PCVD apparatus of FIG. 1.

Firstly, a P-type semiconductor layer was formed on a substrate by PCVD in the first reaction chamber 51A of system A of the apparatus. The pressure in the reaction chamber 51A was in the range of 0.01 to 10 Torr, preferably in the range of 0.01 to 1 Torr, for example, 0.01 Torr. This degree of vacuum was achieved by on-off control of the pressure regulator valve 72 downstream of the turbo pump 87, operating the turbo pump at a rotational speed of 100 r.p.s. The reason why the rotational speed of the turbo pump TP was lowered was to facilitate the pressure control of the regulator valve by lowering the compression ratio of the turbo pump to $10^2$ to $10^3$ from its ordinary ratio of $10^7$ to $10^8$. Since a continuous exhaustion type rotary pump was put in operation according to the invention, it was possible to prevent reverse flows of polymerized oil from the rotary pump 36 as well as of exhaust air, especially oxygen which is contained in the oil.

The reactive gases were fed from the doping system 50. More specifically, as a silicide gas 24, there were employed a silane ($Si_nH_{2n+2}$ where $n \geq 1$, especially $SiH_4$ or $Si_2H_6$) and a silicon fluoride ($SiF_4$, $Si_2F_6$ or $SiF_2$), which were refined and charged in bombs. In this instance, a silane of ultra high purity (a purity of 99.99%) which was easy to handle was used.

In order to form the aimed $Si_xC_{1-x}$ (where $0 < x < 1$), methyl silane ($HSi(CH_3)_3$) with Si—C bond or dimethylsilane ($SiH_2(CH_3)_2$) of 99.99% in purity) was used as a carbide gas 25.

For the layer of silicon carbide $Si_xC_{1-x}$ (where $0 < x1$), boron was mixed as a P-type impurity in a concentration of 0.5% into the aforementioned monosilane to be fed from the bomb 24.

These reactive gases were fed through the respective flowmeters 33 and valves 32 and injected into a cylindrical space 6 of the reaction chamber through the feed nozzle 17 to deposit a film layer of silicon carbide on each substrate. The plasma reaction was carried out by applying high frequency energy across the electrodes 51E and 61E from a high frequency power supply 14 (of 5 to 100 W), at a voltage of +200 V and a frequency of 13.56 MHz.

The substrates were heated to a temperature of 100° to 400° C. (e.g., 200° C.) by heating means similar to an infrared heater, which were provided at the fore and rear ends of the reaction vessel 39A through omitted from illustration.

The infrared heaters were near infrared halogen lamp heaters (with a rated light wavelength of 1 to 3 microns) or far infrared ceramic heaters (with a rated light wavelength of 8 to 25 microns), and were arranged to maintain the cylindrical space, which is surrounded by the holders in the reaction chamber, at a temperature of $210 \pm 10°$ C. (preferably $\pm 5°$ C.).

Thus, the p-type semiconductor film was deposited in a thickness of 30 to 300 Å (e.g., about 200 Å) in the reaction system A under the conditions of $B_2H_6/SiH_4 = 0.5\%$, $MS/(SiH_4 + MS) = 20\%$ (MS: methylsilane), Eg=2.15 eV, $\delta = 1 \times 10^{-6}$ to $3 \times 10^{-5}$ (Ω cm).

The substrates were of a conductive metal (stainless steel, titanium, aluminum or other metals), a semiconductor (silicon, germanium or the like), an insulator (glass, an organic thin film) or a composite material (a transparent conductive layer of an electrode film consisting of a fluorine-added tin oxide layer or an ITO (indium tin oxide) layer alone or a layer of $SnO_2$ formed on glass or a transparent organic resin). In the following example, the substrates consisted of the composite material.

By the plasma chemical vapour reaction for 1 to 5 minutes, a silicon carbide film layer of about 200 Å in thickness, containing boron as a P-type impurity, was formed on each one of the substrates. Then, the substrates bearing the first semiconductor layer were transferred into the buffer chamber 51B after opening the gate 45 in a similar manner as described hereinbefore. This buffer chamber 51B had been vacuumized beforehand to a level lower than $10^{-8}$ Torr, e.g., to $4 \times 10^{-10}$ Torr by a turbo pump 88.

Then, the gate valve 46 was opened to advance the substrates further into the second reaction chamber 51C (system C) which had been maintained at a reduced pressure level of $3 \times 10^{-8}$ Torr by a turbo pump 89.

More specifically, in the reaction system C of FIG. 1, ultra high purity monosilane or disilane (less than 0.1 p.p.m. in water or silicon oxide or oxide gas concentration) was fed from a bomb 28 as a reaction gas for the semiconductor, while, for addition of less than $10^{17}$ $cm^{-3}$ of boron, $B_2H_6$ which had been diluted with hydrogen or silane to a concentration of 0.5 to 30 p.p.m. was fed from a bomb 27, along with a carrier gas from a bomb 26 if necessary.

After reaction in the second reaction chamber 51C, the reactive gas was drawn out to the turbo pump 89 via gate valve 84 and then to the rotary pump 34 through a control valve.

An I-type semiconductor layer of 7000 Å in thickness was formed on twenty $20 \times 60$ cm substrates (having an area of 24000 $cm^2$ in total) at a film forming speed of 2.5 Å/sec under 0.1 Torr by feeding $SiH_4$ at a rate of 60 cc/min. When $Si_2H_6$ was used instead of $SiH_4$, the film forming speed was 28 Å/sec.

With regard to a high-frequency power supply 15 and electrodes 52E and 62E, the operation was same as in the system A described hereinbefore.

Thus, a PI junction was formed by depositing an I-type semiconductor layer by PCVD on the P-type semiconductor layer which was deposited similarly by PCVD in the first reaction chamber 51A.

After forming I-type layers of about 7000 Å in thickness in the system C, the substrates were transferred into a succeeding buffer chamber 51D by an operation similar to the transfer operation described hereinbefore, and then advanced into a succeeding reaction chamber (not shown) to deposit an N-type layer on each substrate similarly by PCVD. This N-type semiconductor layer was formed by PCVD, feeding silane containing phosphine at the rate of $PH_3/SiH_4 = 1.0\%$ after dilution with a four times greater amount of hydrogen of the carrier gas. In other respects, PCVD was carried out under the same conditions as in system A, depositing an N-type polycrystal semiconductor layer with fine crystalline or fibrous structure. Further, an N-type semiconductor layer of silicon carbide of $Si_xC_{1-x}$ (where $0 < x1$) was laminated thereon in a thickness of 10 to 200 Å, for instance, in a thickness of 50 Å, using reactive gas of $MS/(SiH_4 + MS) = 0.2$ (MS: methylsilane). The construction of the reactor was same as in the system A.

After the above-described operations, a 100 to 1500 Å thick ITO layer and a reflective metal electrode (e.g., of aluminum) or a sublimate metal electrode (e.g., of chromium) of about 1 micron in thickness were formed, by vacuum vapour deposition or by spattering, on the substrates (with a PIN junction) which were taken out of a second preliminary chamber (not shown). The photo-voltaic converter (PVC) produced by the above-described method thus had the following layers on a glass substrate: a surface electrode (of $ITO + SnO_2$)—PIN semiconductors—a backside electrode.

With regard to the characteristics of the converter, its effective conversion rate was 8 to 10% (8.5% in average) when an area of 10 cm × 10 cm was irradiated at AMl(100 mW/cm), and was 5.7% when integrated into a hybrid type panel of 40 cm × 60 cm.

Consequently, the open voltage of a single element was 0.85 to 0.9 V (0.87±0.02 V) but it showed a large short current of 18±2 mA/cm² as well as a large fill factor, with reduced irregularities in the panels and batches, proving extremely high utility of the invention.

Figure 2:
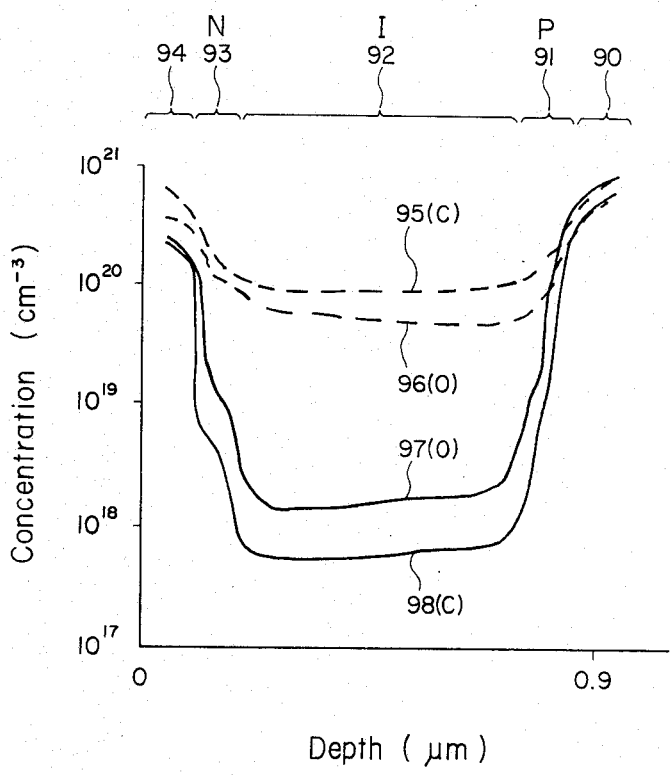
FIG. 2 is a diagram showing impurity distributions in semiconductors (photo-electric converters) produced according to the invention, in comparison with prior art devices for facilitating understanding of the present invention.

Referring to FIG. 2, there are plotted distributions of oxygen and carbon impurities in the semiconductors of PIN type photo-voltaic converters produced by the method of the invention and the conventional method, as measured by SIMS (using Cameca 3F), in relation with the aluminum-ITO backside electrode 94, N-type semiconductor layer 93, I-type semiconductor layer 92, P-type semiconductor layer 91 and transparent conductive layer 90 of tin oxide on the substrate.

In the case of the conventional method using a rotary pump alone in the exhaust system, the semiconductor layers contained impurities in a high concentration as indicated by carbon concentration curve 95 and oxygen concentration curve 96 due to absence of a continuous exhaustion type turbo pump. Especially, the oxygen concentration 96 in the I-type semiconductor 92 is about $5 \times 10^{19}$ cm$^{-3}$, and the carbon concentration 95 reaches a value of about $10^{20}$ cm$^{-3}$ due to backflows of oil components from the oil rotary pump.

In contrast, where an exhaust system according to the invention is used, the carbon concentration becomes less than $1 \times 10^{18}$ cm$^{-3}$ in substantially all regions of the I-type layer 92 as indicated by curve 98. At the same time, the oxygen concentration becomes less than $4 \times 10^{18}$ cm$^{-3}$ in almost all regions of the I-type layer as indicated by curve 97.

The oxygen concentration in the N-type semiconductor layer 93 marks a high value of $18^{18}$ to $10^{20}$ cm$^{-3}$ because aluminum which constitutes the backside electrode 94 contains oxygen in a concentration of $3 \times 10^{20}$ to $6 \times 10^{20}$ cm$^{-3}$.

Further, the high oxygen concentration in the P-type semiconductor layer 91 is presumably attributable to oxygen originating from the moisture content of methylsilane or the like.

The kind of the semiconductor to be formed in the apparatus of the invention is not limited to Si, and it may consists of a single or multiple layers of Ge of the Group IV, $Si_xC_{1-x}$(where $0<x1$), $Si_xGe_{1-x}$(where $0<x1$) or $Si_xSn_{1-x}$(where $0<x1$), of a compound semiconductor (non-oxide) of GaAs, GaAlAs, BP, CdS and the like.

In the above-described embodiment of the invention, the buffer chamber 51B of the system B may be substituted with a simple gate valve.

Although the foregoing example is directed to the formation of a PIN junction, it is to be understood that the present invention can be similarly applied to form a PIP junction, an NIN junction or a PINPIN . . . PIN junction on a substrate.

The reaction for deposition of the P-type semiconductor (e.g., the reaction in the chamber 51A in the foregoing embodiment), the reaction for deposition of the I-type semiconductor (e.g., the reaction in the chamber 51C) and the reaction for deposition of the N-type semiconductor (e.g., the reaction in a chamber not shown in the drawing) may be conducted in separate reaction vessels or successively in a single reaction vessel if desired.

Further, the reactions for deposition of the P-, I- and N-type semiconductor layers may be carried out in the same reaction vessel which is used also for deposition of a non-oxide film or films of Ti, $TiSi_2$, Mo, $MoSi_2$, W, WSi or the like.

Alternatively, it is also possible to employ photo-chemical vapour deposition for the reaction in one of the reaction systems for the foregoing embodiment (e.g., in the system A) if desired. In such a case, it is recommended to use a reactive gas mixture containing MS (methylsilane), $Si_2H_6$ and $B_2H_6$ in the ratios of $MS/(MS+Si_2H_6)=1/5$ and $B_2H_6/Si_2H_6=0.005$, and to employ a low-pressure mercury arc lamp (with a wavelength of 184 nm to 254 nm) as a light source for the photo-chemical reaction.

Namely, the P-, I- and N-tupe semiconductor layers may be formed by photo-chemical vapour deposition alone or in combination with plasma chemical vapour deposition. Thus, the present invention includes I-type semiconductor layers formed by both photo-chemical vapour deposition and plasma chemical vapour deposition.

What is claimed is:

1. An apparatus for conducting chemical vapour deposition under reduced pressure, comprising:
    a means for feeding reactive gases;
    a reaction vessel for depositing a layer from said reactive gases by application of thermal energy, light energy or electrical energy, singly or in combination;
    an exhaust means for exhausting unnecessary reactive gases and/or unnecessary reaction products from said reaction vessel by maintaining the pressure in said reaction vessel in a range of 0.01 to 10 TORR, including a turbo-molecular pump interposed between said reaction vessel and a roughing vacuum pump such as a rotary oil pump.

2. The apparatus of claim 1, wherein chemical vapor deposition is conducted under a pressure range of 0.01 to 10 TORR, after vacuumizing or reducing pressure in said reaction vessel to $3 \times 10^{-8}$ TORR or less.

3. The apparatus of claim 1, wherein a pressure control valve is interposed between said turbo molecular pump and said roughing vacuum pump such as a rotary pump.

4. The apparatus of claim 3, wherein said pressure control valve is easily controllable by lowering the compression ratio of said turbo pump to a range of $10^2$ to $10^3$.

5. The apparatus of claim 1, wherein said reaction vessel comprises separate reaction chambers for depositing P-, I- and N-type semiconductor film layers respectively therein.

6. The apparatus of claim 5, wherein a reaction chamber is provided between said reaction chambers for P-, I- and N-type semiconductors.

7. The apparatus of claim 1, wherein said reaction vessel is used for deposition of a non-oxide film or films of Ti, $TiSi_2$, Mo, $MoSi_2$, W, Wsi or the like.

8. The apparatus of claim 1, wherein said reaction vessel is provided with a single reaction chamber for chemical vapour deposition.

9. The apparatus of claim 1, wherein said reaction vessel is adapted for photo-chemical vapour deposition.

10. A method for conducting chemical vapour deposition under reduced pressure, including means for feeding reactive gases, a reaction vessel for depositing a layer from said reactive gases by application of thermal energy, light energy or electric energy, singly or in combination, an exhaust means including a turbo molecular pump interposed between said reaction vessel and a roughing vacuum pump such as a rotary oil pump, said method comprising:

depositing a layer by maintaining the pressure in said reaction vessel in a range of 0.01 to 10 TORR and by exhausting unnecessary reactive gases and/or unnecessary reaction products from said reaction vessel.

11. The method of claim 10, wherein chemical vapour deposition is conducted under the pressure range of 0.01 to 10 TORR by vacuumizing or reducing the pressure in said reaction vessel to $3 \times 10^{-8}$ TORR or less.

12. The method of claim 10, wherein P-, I- and N-type semiconductors are deposited on a substrate to form thereon semiconductor layers with at least one PIN junction.

13. The method of claim 10, wherein said deposited layer is of a semiconductor of $Si_xC_{1-x}$ (where $0<x1$).

14. The method of claim 10, wherein said deposited layer is a non-oxide film of Ti, $TiSi_2$, Mo, $MSi_2$, W, WSi or the like.

15. The method of claim 12, wherein part of or all of said P-I- and N-semiconductor layers are formed by photochemical vapour deposition.

* * * * *